(12) United States Patent
Ichien et al.

(10) Patent No.: US 9,769,241 B2
(45) Date of Patent: Sep. 19, 2017

(54) DATA TRANSFER DEVICE, DATA TRANSFER METHOD, AND PROGRAM STORAGE MEDIUM

(71) Applicant: NEC CORPORATION, Tokyo (JP)

(72) Inventors: Masumi Ichien, Tokyo (JP); Masaki Kan, Tokyo (JP); Junpei Kamimura, Tokyo (JP); Norihisa Iga, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 179 days.

(21) Appl. No.: 14/417,442

(22) PCT Filed: Jul. 4, 2013

(86) PCT No.: PCT/JP2013/068368
§ 371 (c)(1),
(2) Date: Jan. 26, 2015

(87) PCT Pub. No.: WO2014/024610
PCT Pub. Date: Feb. 13, 2014

(65) Prior Publication Data
US 2015/0180936 A1 Jun. 25, 2015

(30) Foreign Application Priority Data
Aug. 7, 2012 (JP) ................................ 2012-174802

(51) Int. Cl.
| | | |
|---|---|---|
| *H04L 29/08* | (2006.01) | |
| *H04L 29/06* | (2006.01) | |
| *H03M 7/30* | (2006.01) | |

(52) U.S. Cl.
CPC ............ *H04L 67/06* (2013.01); *H03M 7/30* (2013.01); *H03M 7/6017* (2013.01); *H04L 69/04* (2013.01)

(58) Field of Classification Search
CPC ......... G06F 13/00; H04L 67/06; H04L 69/04; H03M 7/30; H03M 7/6017
See application file for complete search history.

(56) References Cited

U.S. PATENT DOCUMENTS

| | | | |
|---|---|---|---|
| 2006/0069879 A1 | 3/2006 | Inoue et al. | |
| 2006/0212625 A1* | 9/2006 | Nakagawa | ............ G06F 3/0608 710/68 |

(Continued)

FOREIGN PATENT DOCUMENTS

| | | |
|---|---|---|
| JP | 62-182919 A | 8/1987 |
| JP | 01-108631 A | 4/1989 |

(Continued)

OTHER PUBLICATIONS

Communication dated Jun. 8, 2016 from the European Patent Office in counterpart Application No. 13828401.3.

(Continued)

*Primary Examiner* — Kim T Nguyen
(74) *Attorney, Agent, or Firm* — Sughrue Mion, PLLC

(57) ABSTRACT

A data transfer device calculates a compression performance value which represents a quantity of data that can be compressed per unit time and a transfer performance value which represents a quantity of data that can be transferred per unit time, and calculates, based on these values, a compression ratio which represents a ratio of data to be compressed and then transferred to total data to be transferred. The data transfer device extracts, from a storage unit which stores data, the data to be transferred, and then compresses part of the extracted data based on the compression ratio, and transfers the compressed data and remaining data to another device. The compression and transfer processes are performed in parallel.

13 Claims, 5 Drawing Sheets

(56) References Cited

U.S. PATENT DOCUMENTS

2010/0095108 A1* 4/2010 Kameyama ............... H04L 9/00
                                                    713/150
2012/0166752 A1* 6/2012 Taniyama ............. G06F 3/0686
                                                    711/170

FOREIGN PATENT DOCUMENTS

| JP | 05-145437 A | 6/1993 |
| JP | 07-162460 A | 6/1995 |
| JP | 07-175707 A | 7/1995 |
| JP | 08-147251 A | 6/1996 |
| JP | 2008-176420 A | 7/2008 |
| WO | 2006/054618 A1 | 5/2006 |

OTHER PUBLICATIONS

"Hadoop", Apache Software Foundation, Internet <URL: http://hadoop.apache.org/>.
International Search Report for PCT/JP2013/068368 dated Oct. 8, 2013.

* cited by examiner

DATA TRANSFER DEVICE, DATA TRANSFER METHOD, AND PROGRAM STORAGE MEDIUM

CROSS REFERENCE TO RELATED APPLICATIONS

This application is a National Stage of International Application No. PCT/JP2013/068368 filed Jul. 4, 2013, claiming priority based on Japanese Patent Application No. 2012-174802 filed Aug. 7, 2012, the contents of all of which are incorporated herein by reference in their entirety.

TECHNICAL FIELD

The present invention relates to a data transfer device, a data transfer method, and a program.

BACKGROUND ART

There has been an emergence of established techniques for analyzing data with high-speed parallel processing. For example, one technique allows to distribute data over machines and perform parallel processing at machines holding the distributed data (refer to NPL 1).

On the other hand, to move (transfer) data from an accumulation device which accumulated data to a data processing device, the data needs to be changed in format or structure compatible with the data processing device.

This change requires the processes of extracting data from the accumulation device (Extract), transforming the data format (Transform), and loading the data into the data processing device (Load). These processes are called ETL processing as their acronym.

In ETL processing, the transforming process often forms a bottleneck. This is attributable to the recent wider bandwidths in storage layer and wider processing bandwidths provided by multi-core computing devices.

One existing solution to this problem is a technique to compress data and transfer it (for example, refer to PTL 1 and PTL 2). PTL 3 also discloses a technique to compress and transfer data in parallel.

PTL 4 and PTL 5 each disclose a technique to sort data into the data to be compressed and the data not to be compressed before data transfer.

CITATION LIST

Patent Literature

PTL 1: Japanese Unexamined Patent Application Publication No. Hei 08-147251
PTL 2: Japanese Unexamined Patent Application Publication No. Hei 07-175707
PTL 3: Japanese Unexamined Patent Application Publication No. Sho 62-182919
PTL 4: Japanese Unexamined Patent Application Publication No. Hei 01-108631
PTL 5: Japanese Unexamined Patent Application Publication No. 2008-176420

Non Patent Literature

NPL 1: "Hadoop", [online], Apache Software Foundation, [retrieved on Jul. 30, 2012], Internet <URL: http://hadoop.apache.org/>

SUMMARY OF INVENTION

Technical Problem

However, compression followed by transfer, like techniques described in PTL 1 and 2, has a problem in that performance of the compression process directly affects transfer performance. For example, if compression performance is lower than transfer performance, the effective transfer throughput may get worse. Note that an effective transfer throughput herein refers to a throughput of transfer in data format suitable for data transfer.

PTL 3 describes a technique to perform compression and transfer in parallel, but this also has a problem in that compression performance directly affects transfer performance as in PTL 1 and 2 because all the transfer data needs to be compressed.

PTL 4 describes a technique to perform compression and transfer in parallel with data sorted into the data to be compressed and the data not to be compressed, but does not explicitly describe means for controlling the sorting into compression and non-compression data.

PTL 5 describes a technique to perform compression and transfer in parallel, with data sorted into the high compression rate data to be compressed and the low compression rate data not to be compressed. However, PTL 5 still has a problem similar to those in PTL 1 to 3 if all the data is either of high compression rate or of low compression rate.

An object of the present invention is to provide a data transfer device, a data transfer method, and a program which overcome the above-described problems.

Solution to Problem

The present invention to solve the above problems, provides a data transfer device which includes: a compression unit which compresses data; a compression performance value calculation unit which calculates a compression performance value representing a quantity of data that the compression unit can compress per unit time; a transfer unit which transfers data to another device; a transfer performance value calculation unit which calculates a transfer performance value representing a quantity of data that the transfer unit can transfer per unit time; a compression ratio calculation unit which calculates, based on the compression performance value and the transfer performance value, a compression ratio representing a ratio of a quantity of data to be compressed and then transferred by the compression unit to total data to be transferred, to a quantity of data to be transferred by the transfer unit; and a compression determination unit which extracts, from a storage unit which stores data, the data to be transferred, and, based on a compression ratio calculated by the compression ratio calculation unit, outputs part of the extracted data to the compression unit and outputs remaining data to the transfer unit, wherein the compression unit and the transfer unit perform processing in parallel.

The present invention provides a data transfer method which includes: a compression performance value calculation step of calculating a compression performance value which represents a quantity of data that can be compressed per unit time; a transfer performance value calculation step of calculating a transfer performance value which represents a quantity of data that can be transferred per unit time; a compression ratio calculation step of calculating, based on the compression performance value and the transfer performance value, a compression ratio which represents a ratio of a quantity of data to be compressed and then transferred to a quantity of all data to be transferred; an extraction step of extracting data to be transferred, the data being extracted from a storage unit which stores data; a compression step of compressing part of extracted data based on the compression ratio; and a transfer step of transferring data compressed in the compression step and remaining data to another device, wherein the compression step and the transfer step are performed in parallel.

The present invention provides a program causing a computer to function as: a compression unit which compresses data; a compression performance value calculation unit which calculates a compression performance value representing a quantity of data that the compression unit can compress per unit time; a transfer unit which transfers data to another device; a transfer performance value calculation unit which calculates a transfer performance value representing a quantity of data that the transfer unit can transfer per unit time; a compression ratio calculation unit which calculates, based on the compression performance value and the transfer performance value, a compression ratio representing a ratio of a quantity of data to be compressed and then transferred by the compression unit to a quantity of all data to be transferred; and a compression determination unit which extracts, from a storage unit which stores data, the data to be transferred, and, based on a compression ratio calculated by the compression ratio calculation unit, outputs part of the extracted data to the compression unit and outputs remaining data to the transfer unit, wherein the compression unit and the transfer unit perform processing in parallel.

Advantageous Effects of Invention

The present invention enables to improve an effective transfer throughput independently of whether compression performance is high or not.

DESCRIPTION OF EMBODIMENTS

<First Exemplary Embodiment>

A first exemplary embodiment of the present invention will now be explained in detail below with reference to the drawings.

Figure 1:
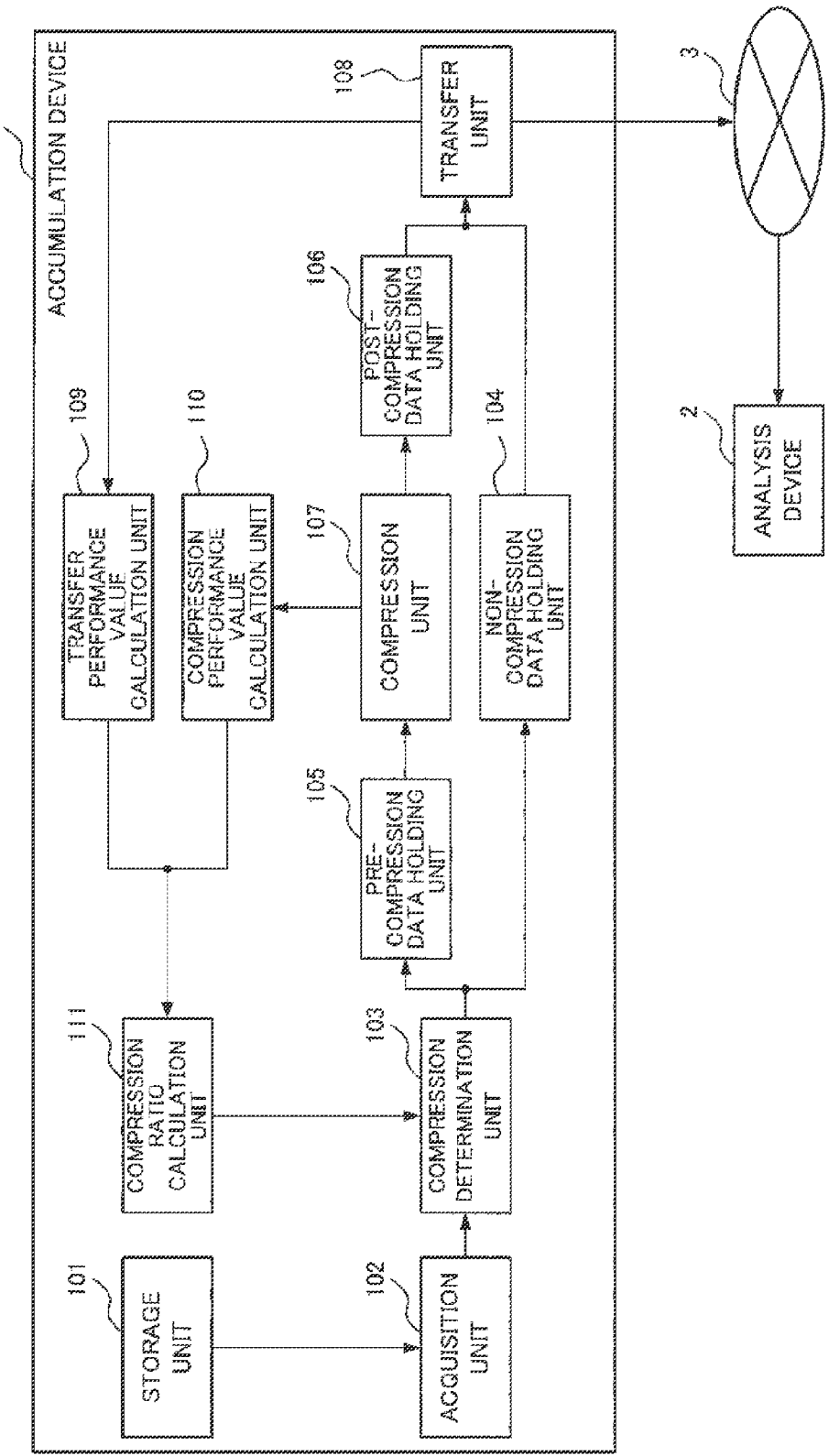
FIG. 1 is a schematic block diagram illustrating a configuration of an analysis system that includes an accumulation device relevant to a first exemplary embodiment of the present invention.

FIG. 1 is a schematic block diagram illustrating a configuration of an analysis system that includes an accumulation device 1 relevant to the first exemplary embodiment of the present invention.

The analysis system includes the accumulation device 1 (data transfer device) and an analysis device 2.

The accumulation device 1 accumulates raw data to be subject to analysis processes later, such as data from a client to be serviced or sensor data to be used for analysis.

The accumulation device 1 and the analysis device 2 are connected with each other via a network 3; the accumulation device 1 transmits data to the analysis device 2 via the network 3.

The analysis device 2 carries out an analysis on the data transferred from the accumulation device 1. Note that although the analysis system includes only one analysis device 2 in the configuration described in this exemplary embodiment, the number of analysis devices 2 is not limited.

The accumulation device 1 includes a storage unit 101, an acquisition unit 102, a compression determination unit 103, a non-compression data holding unit 104, a pre-compression data holding unit 105, a post-compression data holding unit 106, a compression unit 107, a transfer unit 108, a transfer performance value calculation unit 109, a compression performance value calculation unit 110, and a compression ratio calculation unit 111.

The storage unit 101 stores raw data that is to be subject to an analysis later, such as client data and sensor data as described above. Specifically, the storage unit 101 is implemented by a database, a file system, a message queue, or the like.

From the storage unit 101 the acquisition unit 102 acquires data to be transmitted to the analysis device 2.

The compression determination unit 103 determines whether to compress the data acquired by the acquisition unit 102, based on the compression ratio calculated by the compression ratio calculation unit 111. The compression ratio refers to a ratio of a quantity of data to be compressed to a quantity of data to be transferred.

For example, assuming that the quantity of data to be compressed and then transferred is c, and the quantity of data to be transferred without compression is s, then the total quantity of data to be transferred is "c+s," and thus the compression ratio is represented by "c/(c+s)."

In addition, the compression determination unit 103 records the data determined not to be compressed into the non-compression data holding unit 104, while recording the data determined to be compressed into the pre-compression data holding unit 105 (enqueue, push).

The non-compression data holding unit 104 temporarily holds data which should be transferred without compression to the analysis device 2.

The pre-compression data holding unit 105 temporarily holds data which is going to be compressed by the compression unit 107.

The post-compression data holding unit 106 temporarily holds data which has been compressed by the compression unit 107.

Each of the holding units (non-compression data holding unit 104, pre-compression data holding unit 105, and post-compression data holding unit 106) is implemented by a FIFO (First In First Out) buffer or the like.

The compression unit 107 sequentially takes out data from the pre-compression data holding unit 105 (dequeue, pop) to compress the data. There is no limitation on a method for compression by the compression unit 107. The compression unit 107 also records compressed data into the post-compression data holding unit 106.

Note that "taking out data from a holding unit" as used herein refers to deleting data after reading it from a holding unit.

The transfer unit 108 sequentially takes out data from the non-compression data holding unit 104 or the post-compression data holding unit 106 and transfers the data to the analysis device 2 via the network 3.

Note that the transfer unit 108 selects either one of the non-compression data holding unit 104 and the post-compression data holding unit 106 as a source holding unit from which data is taken out, and after taking out all the data from the holding unit, the transfer unit 108 selects the other holding unit as a source holding unit from which data is taken out. In other words, the transfer unit 108 repeats the cycle of transferring data held by the non-compression data holding unit 104 and then transferring data held by the post-compression data holding unit 106.

Furthermore, compression by the compression unit 107 and transfer by the transfer unit 108 are performed in parallel.

While monitoring the transfer unit 108, the transfer performance value calculation unit 109 calculates a transfer performance value which represents a quantity of data that the transfer unit 108 can transfer per unit time. A transfer performance value as used in this exemplary embodiment refers to a transfer throughput in megabytes per second.

While monitoring the compression unit 107, the compression performance value calculation unit 110 calculates a compression performance value which represents a quantity of data that the compression unit 107 can compress per unit time, and also calculates a data compression rate of the compression unit 107.

A compression performance value as used in this exemplary embodiment refers to a compression throughput in megabytes per second. The compression rate is calculated by dividing the quantity of post-compression data by the quantity of pre-compression data. For example, if the compression unit 107 compresses 100 bytes of data into 10 bytes of data, the compression rate is 10/100 =0.1.

The compression ratio calculation unit 111 calculates a compression ratio, based on the transfer performance value calculated by the transfer performance value calculation unit 109 and on the compression performance value calculated by the compression performance value calculation unit 110. As a compression ratio, the compression ratio calculation unit 111 calculates such a ratio of data quantities that makes a time required for compression according to the compression performance value be equal to a time required for transfer according to the transfer performance value.

According to the compression ratio calculated by the compression ratio calculation unit 111, the compression determination unit 103 sorts data into the pre-compression data holding unit 105 and the non-compression data holding unit 104 at such a ratio that makes a time required for compression be equal to a time required for transfer. As a result, at the time when the transfer unit 108 finishes transferring all the data held by the non-compression data holding unit 104, the compression unit 107 should finish compressing all the data held by the pre-compression data holding unit 105.

That is, according to this exemplary embodiment, the transfer unit 108 need not wait for completion of compression by the compression unit 107, thus ensuring that the effective transfer throughput is improved regardless of whether compression performance is high or not.

Now operations of the accumulation device 1 according to this exemplary embodiment will be explained.

In the first place, data acquisition processing performed in the accumulation device 1 according to this exemplary embodiment is explained.

Figure 2:
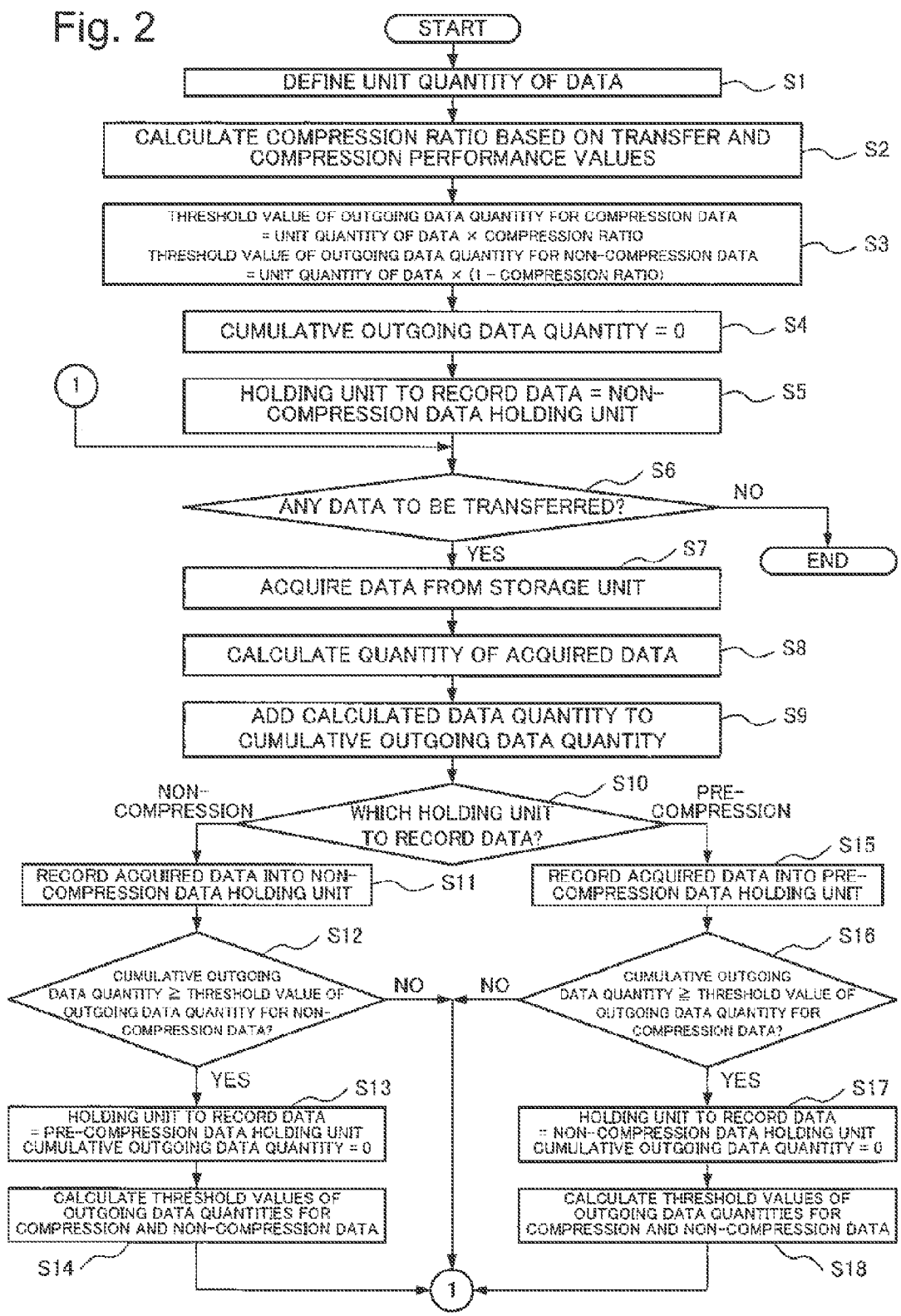
FIG. 2 is a flowchart illustrating operations of data acquisition in the accumulation device according to the first exemplary embodiment of the invention.

FIG. 2 is a flowchart illustrating operations of data acquisition in the accumulation device 1 according to the first exemplary embodiment of the invention.

As an initial setting, the compression determination unit 103 defines and records into internal memory a unit quantity of data for data acquisition performed in the accumulation device 1 according to the administrator's input (Step S1).

A unit quantity of data for data acquisition refers to a quantity of data that the compression determination unit 103 will use as a basis of calculating a data quantity for compression, and is the sum of quantities of data to be transferred by the transfer unit 108 in one cycle of transferring non-compression data and post-compression data.

Next, the compression ratio calculation unit 111 calculates a compression ratio by applying the transfer and compression performance values to a predetermined equation (Step S2).

The equation for calculating the compression ratio can be derived by modeling transfer and compression performance values, for example, by means of mathematical programming. This exemplary embodiment uses "$C/(N+C-Ca)$" to calculate the compression ratio, where C represents the compression performance value, N represents the transfer performance value, and a represents the compression rate.

For example, if the compression performance value calculated by the compression performance value calculation unit 110 is 20 megabytes per second, the compression rate is 0.3, and the transfer performance value calculated by the transfer performance value calculation unit 109 is 100 megabytes per second, the compression ratio calculation unit 111 will calculate the compression ratio as 0.175.

For initial execution, the compression performance value calculation unit 110 and the transfer performance value calculation unit 109 respectively output initial compression performance value and initial transfer performance value, as measured in advance, to the compression ratio calculation unit 111.

If the time for transferring post-compression data is sufficiently short, an alternative equation "$C/(N+C)$" without a compression rate may be used for calculating a compression ratio.

Note that the method for calculating a compression ratio is not limited to "$C/(N+C-Ca)$" or "$C/(N+C)$"; any other equation derived by modeling transfer and compression performance values may be acceptable.

Next, the compression determination unit 103 defines and records into the internal memory a threshold value of an outgoing data quantity for non-compression data and a threshold value of an outgoing data quantity for compression data, based on the unit quantity of data defined in Step S1 and on the compression ratio calculated by the compression ratio calculation unit 111 in Step S2 (Step S3).

Specifically, the threshold value of an outgoing data quantity for compression data is calculated by multiplying the unit quantity of data by the compression ratio, while the threshold value of an outgoing data quantity for non-compression data is calculated by multiplying the unit quantity of data by the complement of the compression ratio (1−compression ratio).

For example, if the unit quantity of data is 1,000 kilobytes and the compression ratio is 0.3, the compression determination unit 103 calculates the threshold value of an outgoing data quantity for compression data to be 300 kilobytes, and the threshold value of an outgoing data quantity for non-compression data to be 700 kilobytes.

In this case, 700 kilobytes of data out of 1,000 kilobyte-data will be transferred without compression, while 300 kilobytes of data will be compressed and then transferred. Note that, in this case, a time required for compressing 300 kilobytes of data performed by the compression unit 107 is approximately equal to a time required for transferring 700 kilobytes of data performed by the transfer unit 108.

Next, the compression determination unit 103 sets the cumulative outgoing data quantity to the initial value, 0, and records this value into the internal memory, where the cumulative outgoing data quantity represents a quantity of data recorded in the non-compression data holding unit 104 or the pre-compression data holding unit 105 (Step S4).

The compression determination unit 103 also selects the non-compression data holding unit 104 as a holding unit to record the data acquired by the acquisition unit 102, and records information on the holding unit into the internal memory (Step S5).

Initial settings for data acquisition are now finished.

After the initial settings, the acquisition unit 102 references the storage unit 101 to determine whether there is data to be transferred to the analysis device 2 (Step S6).

When the acquisition unit 102 determines that there is data to be transferred to the analysis device 2 (Step S6: YES), the acquisition unit 102 acquires the data (or one set of data if there are a plurality of sets of data) (Step S7).

Next, the acquisition unit 102 calculates the quantity of acquired data (Step S8). Then, the compression determination unit 103 adds the calculated quantity of data to the cumulative outgoing data quantity stored in the internal memory (Step S9).

Next, the compression determination unit 103 determines which unit is selected in the internal memory as a holding unit to record data: the non-compression data holding unit 104 or the pre-compression data holding unit 105 (Step S10).

If the non-compression data holding unit 104 is selected as a holding unit to record data (Step S10: Non-compression), the compression determination unit 103 records the data acquired by the acquisition unit 102 into the non-compression data holding unit 104 (Step S11).

Next, the compression determination unit 103 determines whether the cumulative outgoing data quantity stored in the internal memory is equal to or greater than the threshold value of an outgoing data quantity for non-compression data (Step S12). If the cumulative outgoing data quantity is less than the threshold value of an outgoing data quantity for non-compression data (Step S12: NO), a step returns to Step S6 and the accumulation device 1 proceeds to the next data processing.

On the other hand, if the cumulative outgoing data quantity is equal to or greater than the threshold value of an outgoing data quantity for non-compression data (Step S12: YES), the compression determination unit 103 rewrites the internal memory storing information on the holding unit to record data with the information on the pre-compression data holding unit 105, and resets the cumulative outgoing data quantity to 0 (Step S13).

At the same time, the transfer performance value calculation unit 109 and the compression performance value calculation unit 110 calculate a transfer performance value and a compression performance value, respectively.

Next, the compression ratio calculation unit 111 calculates a compression ratio, and, based on the compression ratio, the compression determination unit 103 calculates and records into the internal memory a threshold value of an outgoing data quantity for compression data and a threshold value of an outgoing data quantity for non-compression data (Step S14).

Then, a step returns to Step S6 and the accumulation device 1 proceeds to the next data processing.

If in Step S10 the pre-compression data holding unit 105 is selected as a holding unit to record data (Step S10: Pre-compression), the compression determination unit 103 records the data acquired by the acquisition unit 102 into the pre-compression data holding unit 105 (Step S15).

Next, the compression determination unit 103 determines whether the cumulative outgoing data quantity stored in the internal memory is equal to or greater than the threshold value of an outgoing data quantity for compression data (Step S16). If the cumulative outgoing data quantity is less than the threshold value of an outgoing data quantity for compression data (Step S16: NO), a step returns to Step S6 and the accumulation device 1 proceeds to the next data processing.

On the other hand, if the cumulative outgoing data quantity is equal to or greater than the threshold value of an outgoing data quantity for compression data (Step S16: YES), the compression determination unit 103 rewrites the internal memory storing information on the holding unit to record data with the information on the non-compression data holding unit 104, and resets the cumulative outgoing data quantity to 0 (Step S17).

At the same time, the transfer performance value calculation unit 109 and the compression performance value calculation unit 110 calculate a transfer performance value and a compression performance value, respectively.

Next, the compression ratio calculation unit 111 calculates a compression ratio, and, based on the compression ratio, the compression determination unit 103 calculates and records into the internal memory a threshold value of an outgoing data quantity for compression data and a threshold value of an outgoing data quantity for non-compression data (Step S18).

Then, a step returns to Step S6 and the accumulation device 1 proceeds to the next data processing.

When the acquisition unit 102 determines that there is no data to be transferred to the analysis device 2 in Step 6 (Step S6: NO), in other words when the acquisition unit 102 has acquired all the data to be transferred to the analysis device 2, the accumulation device 1 stops the data acquisition processing.

Now data transfer processing performed in the accumulation device 1 according to this exemplary embodiment is explained below.

Figure 3:
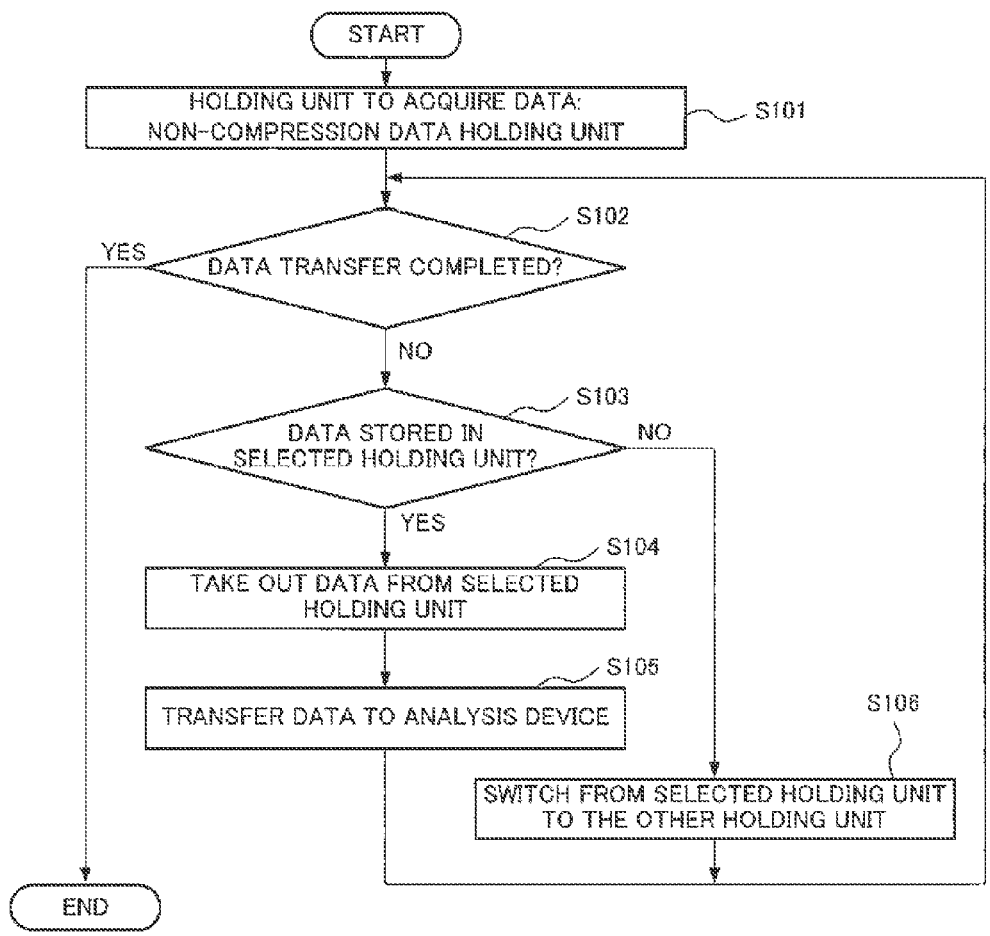
FIG. 3 is a flowchart illustrating operations of data transfer in the accumulation device according to the first exemplary embodiment of the invention.

FIG. 3 is a flowchart illustrating operations of data transfer in the accumulation device 1 according to the first exemplary embodiment of the present invention.

First, the transfer unit 108 selects the non-compression data holding unit 104 as a holding unit to acquire data to be transferred, and records information on the holding unit into the internal memory (Step S101).

Next, the transfer unit 108 determines whether all the data for transfer has been transferred (Step S102).

Whether the data has been transferred can be determined, for example, if a request to stop processing is externally input by means of an operation by the administrator or the like or interrupt processing.

When the transfer unit 108 determines that all the data has not been transferred (Step S102: NO), the transfer unit 108 determines whether any data is stored in the holding unit (the non-compression data holding unit 104 or the post-compression data holding unit 106) selected as a holding unit to acquire data to be transferred (Step S103).

If the transfer unit 108 determines that data is stored in the holding unit selected as a holding unit to acquire data to be transferred (Step S103: YES), the transfer unit 108 takes out the data from the holding unit (Step S104).

Then, the transfer unit 108 gives information for identifying the type of data to the taken data, and transfers the data to the analysis device via the network 3 (Step S105).

The information for identifying the type of data as used herein indicates whether the data is compressed or not. Note that while the transfer unit 108 is transferring the data stored in the non-compression data holding unit 104, the compression unit 107, in parallel with the transfer processing, is compressing the data stored in the pre-compression data holding unit 105 and sequentially recording compressed data into the post-compression data holding unit 106. As a result, at the time when the transfer unit 108 finishes transferring all the data stored in the non-compression data holding unit 104, the compression unit 107 should finish compressing all the data stored in the pre-compression data holding unit 105.

Then, a step returns to Step S102 and the accumulation device 1 proceeds to the next data transfer.

On the other hand, in Step S103, when the transfer unit 108 determines that no data is stored in the holding unit selected as a holding unit to acquire the data to be transferred (Step S103: NO), the transfer unit 108 switches the information on the holding unit to acquire data to be transferred, as stored in the internal memory, to the other holding unit (Step S106).

That is, if the information on a holding unit to acquire data, as stored in the internal memory, represents the non-compression data holding unit 104, the transfer unit 108 switches over to the post-compression data holding unit 106 as a holding unit to acquire data to be transferred.

If the information on a holding unit to acquire data, as stored in the internal memory, represents the post-compression data holding unit 106, the transfer unit 108 switches over to the non-compression data holding unit 104 as a holding unit to acquire data to be transferred. Then, a step returns to Step S102 and the accumulation device 1 proceeds to the next data transfer.

On the other hand, in Step S102, when the transfer unit 108 determines that all the data has been transferred (Step S102: YES), the accumulation device 1 stops data transfer processing.

Upon receipt of the data transferred from the accumulation device 1, the analysis device 2 determines, based on the information given in Step S105, whether or not the data is compressed, and accordingly sorts data into the storage unit 101 to decompress the compressed data only. Consequently the analysis device 2 can receive data without degradation of performance.

In this way, according to this exemplary embodiment, the accumulation device 1 can compress and transfer data in parallel without degrading transfer performance by sorting data into that to be compressed and that not to be compressed, depending on a compression ratio appropriate for the compression performance. These results in a transfer time shortened by the reduction in a quantity of transfer data owing to compression, and thus the effective transfer throughput can be improved.

Furthermore, according to this exemplary embodiment, while the transfer and compression processes are being executed, the transfer performance value calculation unit 109 and the compression performance value calculation unit 110 in the accumulation device 1 respectively calculate transfer performance and compression performance to recalculate the compression ratio(step S14, step S18). This allows to continuously define an optimum compression ratio appropriate for the current status.

<Second Exemplary Embodiment>

A second exemplary embodiment of the present invention will now be explained.

Figure 4:
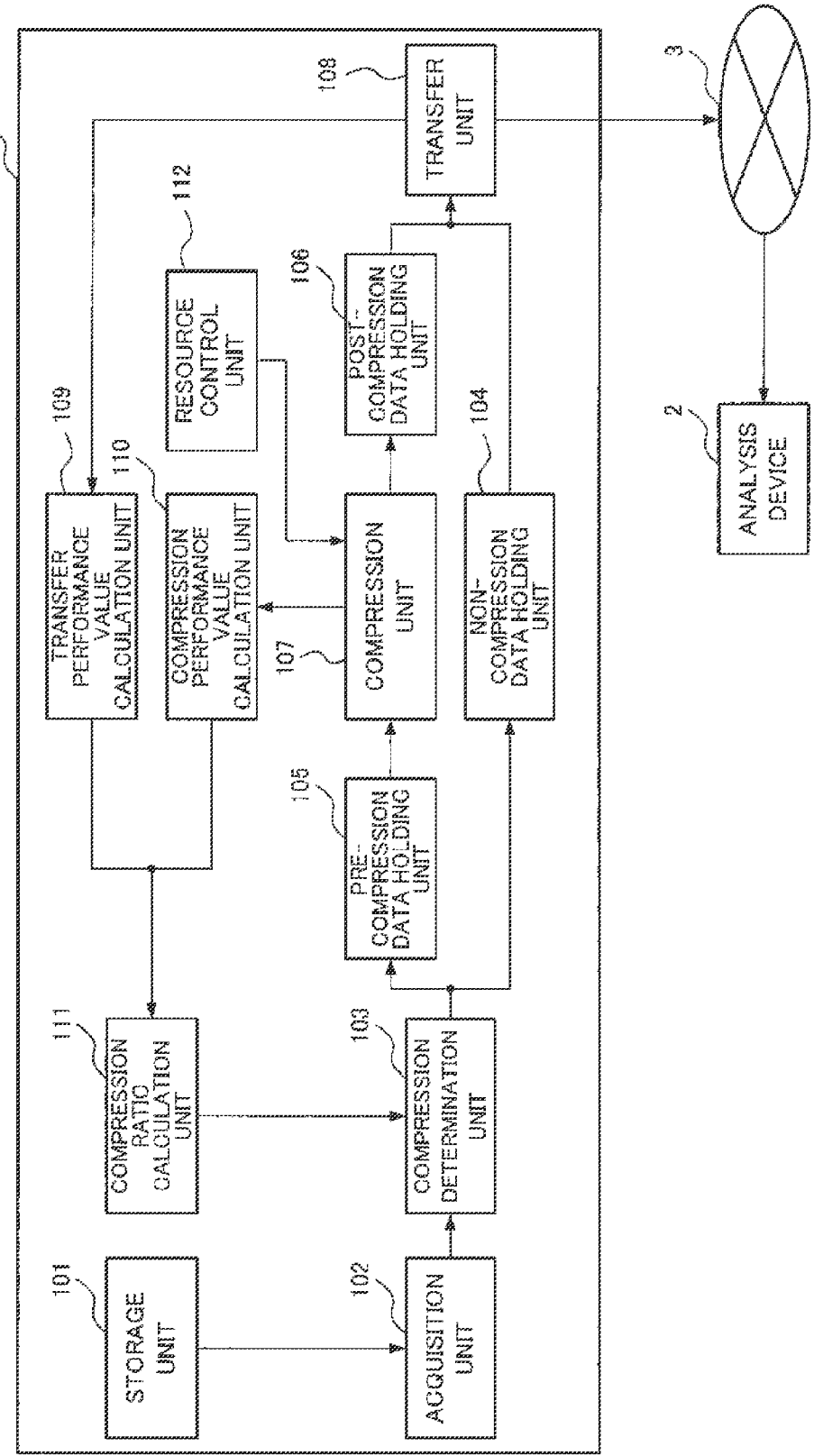
FIG. 4 is a schematic block diagram illustrating a configuration of an analysis system relevant to a second exemplary embodiment of the invention.

FIG. 4 is a schematic block diagram illustrating a configuration of an analysis system relevant to the second exemplary embodiment of the present invention.

An accumulation device 1 in the analysis system relevant to the second exemplary embodiment further includes a resource control unit 112 in addition to the configuration of the accumulation device 1 of the first exemplary embodiment.

The resource control unit 112 identifies available computational resources in the device, and, based on the availability of the computational resources, controls the number of parallel executions in the compression unit 107, utilization priority of computational resources, and the like.

Computational resources as used herein include processing and computing units such as CPU (Central Processing Unit) and GPU (Graphics Processing Unit) and main memory units such as RAM (Random Access Memory).

Now operations of the accumulation device 1 relevant to the second exemplary embodiment is explained below assuming that, as an example, a CPU composed of four cores is used as a computational resource in the accumulation device 1. When the resource control unit 112 calculates load on the computational resource during a transfer process to determine that the usage rate of two cores is 100% and that of remaining cores is 0%, the resource control unit 112 increases the number of parallel executions in the compression unit 107 by 2.

This enhances compression performance of the compression unit 107, leading to a higher compression ratio calculated by the compression ratio calculation unit 111 than the ratio prior to the increase in the number of parallel executions. As a result, the quantity of data to be compressed is increased relative to the quantity of transfer data, and thus the effective transfer throughput can be further improved.

While some exemplary embodiments of the present invention have been described in detail with reference to the drawings, specific configuration are not limited to the ones described above, and various design changes and the like may be made without departing from the gist of the present invention.

For example, in the above-described exemplary embodiments a data transfer device relevant to the present invention is implemented in the accumulation device 1, but configurations are not limited to this and may alternatively include the accumulation device 1 having the storage unit 101 and include a separate data transfer device.

In addition, in the above-described exemplary embodiments the compression ratio is calculated by the compression ratio calculation unit 111 based on a quantity of data, but a calculation method is not limited to this.

For example, the compression ratio may be calculated based on the number of data acquisitions if the quantity of data acquired by the acquisition unit 102 is kept constant, or the compression ratio may be calculated based on time if the throughput of data acquisition by the acquisition unit 102 is kept constant.

Furthermore, in the above-described exemplary embodiments, during initial settings the compression determination unit 103 selects the non-compression data holding unit 104 as a holding unit to record data (Step S5), while the transfer unit 108 selects the non-compression data holding unit 104 as a holding unit to acquire data to be transferred (Step S101), but settings are not limited to this.

For example, during initial settings the pre-compression data holding unit 105 may be selected as a holding unit to record data, while the post-compression data holding unit 106 may be selected as a holding unit to acquire data to be transferred.

However, in this case, the transfer unit 108 cannot start transferring data immediately because in the initial state the compression unit 107 has not completed compressing data and thus data has not been recorded in the post-compression data holding unit 106.

<Basic Configuration>

Figure 5:
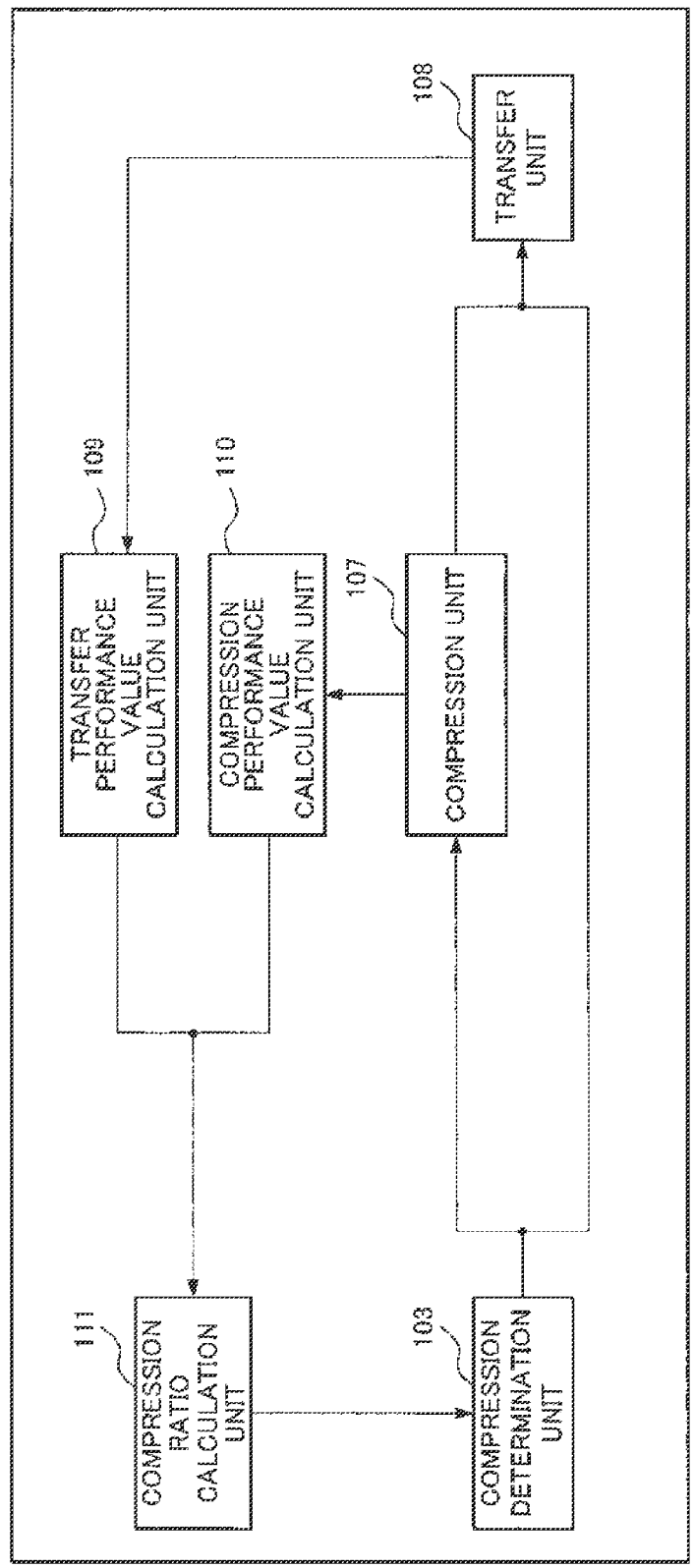
FIG. 5 is a schematic block diagram illustrating a basic configuration of a data transfer device according to the present invention.

FIG. 5 is a schematic block diagram illustrating a basic configuration of a data transfer device according to the present invention.

In the above-described exemplary embodiments, FIGS. 1 and 4 illustrate configurations of a data transfer device according to the present invention only as an exemplary embodiment, and the basic configuration of a data transfer device of the present invention is as illustrated in FIG. 5.

That is, the basic configuration of a data transfer device according to the present invention includes a compression determination unit 103, a compression unit 107, a transfer unit 108, a transfer performance value calculation unit 109, a compression performance value calculation unit 110, and a compression ratio calculation unit 111.

Based on the compression ratio calculated by the compression ratio calculation unit 111, the compression determination unit 103 outputs a part of extracted data to the compression unit 107 and outputs remaining data to the transfer unit 108.

The compression unit 107 compresses data. The transfer unit 108 transfers data to another device.

The transfer performance value calculation unit 109 calculates a transfer performance value which represents a quantity of data that the transfer unit 108 can transfer per unit time. The compression performance value calculation unit 110 calculates a compression performance value which represents a quantity of data that the compression unit 107 can compress per unit time.

The compression ratio calculation unit 111 calculates, based on the above compression and transfer performance values, a compression ratio which represents the ratio of a quantity of data to be compressed by the compression unit 107 to a quantity of data to be transferred by the transfer unit 108.

As a result, the data transfer device can improve the effective transfer throughput independently of whether compression performance is high or not.

The above data transfer device contains a computer system.

In addition, above-described operations of the individual process units are stored in a computer-readable record medium in the form of a program, and the above processes are performed in such a way that the computer reads and executes the program.

A computer-readable record media as mentioned herein refers to a magnetic disk, a magneto-optical disk, CD-ROM, DVD-ROM, semiconductor memory, or the like.

The computer program may also be delivered to a computer via a communication line, and the computer may execute the delivered program.

The above program may also be intended for implementing part of the above-described functions.

Furthermore, the program may be a so-called difference file (difference program), i.e. a program implementing the above-described functions in combination with another program that is already recorded in the computer system.

INDUSTRIAL APPLICABILITY

The present invention enables to improve an effective transfer throughput independently of whether compression performance is high or not.

REFERENCE SIGNS LIST

1 Accumulation device
2 Analysis device
3 Network
101 Storage unit
102 Acquisition unit
103 Compression determination unit
104 Non-compression data holding unit
105 Pre-compression data holding unit
106 Post-compression data holding unit
107 Compression unit
108 Transfer unit
109 Transfer performance value calculation unit
110 Compression performance value calculation unit
111 Compression ratio calculation unit
112 Resource control unit

The invention claimed is:

1. A data transfer device comprising:
at least one processor configured to execute:
a compression unit configured to compress a first portion of data to be transferred;
a compression performance value calculation unit configured to calculate a compression performance value representing a quantity of data compressible by the compression unit per unit time;
a transfer unit configured to transfer the data to be transferred to another device, the data to be transferred including the first portion of the data to be transferred that is compressed and a second portion of the data to be transferred that is not compressed;
a transfer performance value calculation unit configured to calculate a transfer performance value representing a quantity of data transferrable by the transfer unit per unit time;
a compression ratio calculation unit configured to calculate, based on the compression performance value and the transfer performance value, a compression ratio representing a ratio of the quantity of data compressible by the compression unit to the quantity of data transferrable by the transfer unit; and
a compression determination unit configured to extract the data to be transferred from a storage unit and based on the compression ratio, configured to output the first portion of the data to be transferred to the compression unit and configured to output the second portion of the data to be transferred to the transfer unit.

2. The data transfer device according to claim 1, further comprising:
a pre-compression data holding unit which holds the first portion of the data before the compression by the compression unit;
a post-compression data holding unit which holds the first portion of the data compressed by the compression unit; and
a non-compression data holding unit which holds the second portion of the data to be transferred without being compressed by the compression unit,
wherein the compression determination unit, based on the compression ratio, records the first portion of the data from the storage unit into the pre-compression data holding unit and records the second portion of the data from the storage unit into the non-compression data holding unit, and wherein the transfer unit transfers the data stored in one of the post-compression data holding unit and the non-compression data holding unit to the other device, and upon completion of transfer of all the data stored in the one of the post-compression data holding unit and the non-compression data holding unit, transfers the data stored in the other of the one of the post-compression data holding unit and the non-compression data holding unit to the other device.

3. The data transfer device according to claim 1, wherein the compression ratio is calculated to a time required for compression according to the compression performance value be equal to a time required for transfer according to the transfer performance value.

4. The data transfer device according to claim 1, wherein the compression performance value calculation unit calculates a compression rate of data performed by the compression unit, and wherein the compression ratio calculation unit calculates the compression ratio based on the compression performance value, the transfer performance value, and the compression rate.

5. The data transfer device according to claim 4, wherein the compression ratio is a value calculated by dividing the compression performance value by a resulting value of subtraction where a multiplication product of the transfer performance value and the compression rate is subtracted from a sum of the compression performance value and the transfer performance value.

6. The data transfer device according to claim 1, comprising a resource control unit which assigns a resource to processing in the compression unit depending on a quantity of an extra computational resource in the device.

7. The data transfer device according claim 1, wherein the compression of the first portion of the data by the compression unit and the transfer of the second portion of the data by the transfer unit are performed in parallel.

8. A data transfer method performed by at least one processor, the method comprising:
calculating a compression performance value which represents a quantity of data compressible by a compression unit per unit time;
calculating a transfer performance value which represents a quantity of data transferrable by a transfer unit per unit time;
calculating, based on the compression performance value and the transfer performance value, a compression ratio which represents a ratio of a quantity of data compressible by the compression unit to the quantity of data transferrable by the transferring unit;
extracting data to be transferred from a storage unit, the data to be transferred including a first portion of the data to be transferred that is compressed and a second portion of the data to be transferred that is not compressed;
compressing the first portion of the data to be transferred based on the compression ratio; and
transferring the compressed first portion of the data and the second portion of the data to another device.

9. The data transfer method according to claim 8, further comprising:

recording, based on the compression ratio, the first portion of the data into a pre-compression data holding unit before compressing the first portion of the data by the compression unit;
recording the first portion of the data in a post-compression data holding unit after compression of the first portion of data by the compressing unit; and
recording, based on the compression ratio, the second portions of the data into a non-compression data holding unit,
wherein the transferring of the data includes transferring data stored in one of the post-compression data holding unit and the non-compression data holding unit to the other device, and upon completion of transfer of all the data stored in the one of the post-compression data holding unit and the non-compression data holding unit, transferring data stored in the other of the one of the post-compression data holding unit and the non-compression data holding unit to the other device.

10. The data transfer method according to claim 8, wherein the compression of the first portion of the data by the compression unit and the transfer of the second portion of the data by the transfer unit are performed in parallel.

11. A non-transitory computer-readable storage medium storing a program, the program causing at least one processor of a computer to function as:
a compression unit configured to compress a first portion of data to be transferred;
a compression performance value calculation unit configured to calculate a compression performance value representing a quantity of data compressible by the compression unit per unit time;
a transfer unit configured to transfer the data to be transferred to another device, the data to be transferred including the first portion of the data to be transferred that is compressed and a second portion of the data to be transferred that is not compressed;
a transfer performance value calculation unit configured to calculate a transfer performance value representing a quantity of data transferrable by the transfer unit per unit time;
a compression ratio calculation unit configured to calculate, based on the compression performance value and the transfer performance value, a compression ratio representing a ratio of the quantity of data compressible by the compression unit to the quantity of data transferrable by the transfer unit; and
a compression determination unit configured to extract the data to be transferred from a storage unit, and based on the compression ratio configured to output the first portion of the data to be transferred to the compression unit and output the second portion of the data to be transferred to the transfer unit.

12. The non-transitory computer-readable storage medium storing the program according to claim 11, wherein the program causes the computer to further function as:
a pre-compression data holding unit which holds the first portion of the data before the compression by the compression unit;
a post-compression data holding unit which holds the first portion of the data compressed by the compression unit; and
a non-compression data holding unit which holds the second portion of the data to be transferred without being compressed by the compression unit,
wherein the compression determination unit based on the compression ratio, records the first portion of the data from the storage unit into the pre-compression data holding unit and records the second portion of the data from the storage unit into the non-compression data holding unit, and wherein the transfer unit transfers the data stored in one of the post-compression data holding unit and the non-compression data holding unit to the other device, and upon completion of transfer of all the data stored in the one of the post-compression data holding unit and the non-compression data holding unit, transfers the data stored in the other of the one of the post-compression data holding unit and the non-compression data holding unit to the other device.

13. The non-transitory-computer-readable storage medium storing the program according to claim 11, wherein the compression of the first portion of the data by the compression unit and the transfer of the second portion of the data by the transfer unit are performed in parallel.

\* \* \* \* \*